United States Patent

Yoshida et al.

[11] Patent Number: 5,856,066
[45] Date of Patent: Jan. 5, 1999

[54] DEVELOPER FOR PHOTOSENSITIVE RESIN PRINTING PLATE AND PROCESS FOR PRODUCING PHOTOSENSITIVE RESIN PRINTING PLATE

[75] Inventors: Masahiro Yoshida; Kenji Fujioka, both of Fuji, Japan

[73] Assignee: Asahi Kasei Kogyo Kabushiki Kaisha, Osaka, Japan

[21] Appl. No.: 808,989

[22] Filed: Feb. 20, 1997

[30] Foreign Application Priority Data

Feb. 20, 1996 [JP] Japan .................................. 8-055378

[51] Int. Cl.$^6$ ............................... G03F 7/30; G03F 7/32; G03F 7/40
[52] U.S. Cl. ........................ 430/309; 430/331; 430/306; 430/328; 252/600
[58] Field of Search ..................... 430/309, 331, 430/306, 328; 522/37, 46, 48, 53; 252/600

[56] References Cited

U.S. PATENT DOCUMENTS

| | | | |
|---|---|---|---|
| 3,574,617 | 4/1971 | Skoultchi | 96/35.1 |
| 3,776,889 | 12/1973 | Pande et al. | 260/77.5 |
| 4,202,696 | 5/1980 | Takahashi et al. | 430/306 |
| 4,767,642 | 8/1988 | Shimizu et al. | 427/54.1 |
| 4,791,213 | 12/1988 | Gawne et al. | 549/27 |
| 4,861,916 | 8/1989 | Köhler et al. | 568/337 |
| 5,043,362 | 8/1991 | Balfour et al. | 522/14 |
| 5,045,435 | 9/1991 | Adams et al. | 430/288.1 |
| 5,168,087 | 12/1992 | Li Bassi et al. | 502/164 |

FOREIGN PATENT DOCUMENTS

| | | |
|---|---|---|
| 0387578 | 9/1990 | European Pat. Off. . |
| 56-16182 | 4/1981 | Japan . |
| 61-120142 | 6/1986 | Japan . |
| 04-366847 | 12/1992 | Japan . |
| 4366847 | 12/1992 | Japan . |
| WO86/02177 | 4/1986 | WIPO . |

OTHER PUBLICATIONS

Grant et al, eds, *Grant & Hackh's Chemical Dictionary* 5th ed, McGraw–Hill Book Co., New York, NY 1987, p. 541.
Partial English Translation of JP 04–366847 submitted.

*Primary Examiner*—Cynthia Hamilton
*Attorney, Agent, or Firm*—Birch, Stewart, Kolasch & Birch, LLP

[57] ABSTRACT

A process for producing a photosensitive resin printing plate, which comprises the steps of developing a photosensitive resin which has been exposed to light, with a composition comprising a developer for a photosensitive resin and a hydrogen-abstracting agent which can abstract hydrogen atoms from a compound upon irradiation with an active radiation, and thereafter, irradiating the surface of an obtained cured plate with an active radiation.

3 Claims, No Drawings

DEVELOPER FOR PHOTOSENSITIVE RESIN PRINTING PLATE AND PROCESS FOR PRODUCING PHOTOSENSITIVE RESIN PRINTING PLATE

BACKGROUND OF THE INVENTION

1. Field of the Invention

This invention relates to a developer for a photosensitive resin printing plate comprising a hydrogen-abstracting agent and a process for producing a photosensitive resin printing plate using said developer which printing plate is broadly used as a printing plate for letterpress printing (said production process being referred to as a plate-making process or plate-making in some cases hereinafter).

2. Related Art

A photosensitive resin printing plate is generally obtained by an exposure step in which only the photosensitive layer of a relief portion is cured by a radical polymerization reaction caused by irradiation with an active radiation and a development step subsequent to the exposure step in which development step the uncured resin in other portions than the relief portion is dissolved in and removed with a given washing solution (developer) or swollen with and dispersed in the washing solution and then mechanically removed, thereby allowing only the cured portion to appear as a relief on the surface of the printing plate.

In general, with a photosensitive resin which is cured by a radical polymerization reaction, a vanishment reaction of a radical active species is caused competitively with a propagation reaction of the radical active species, and hence, when the reaction rate is increased to heighten the sensitivity of the resin, it becomes difficult to increase the degree of polymerization which is governed by the concentration of an initiator. In order to obtain a relief suitable for printing, and in order to obtain the necessary sensitivity (reaction rate) for efficiently and simply carrying out the plate-making works, it is necessary for the photosensitive resin to contain a given amount of an initiator. However, there is a limit in degree of polymerization of resin and hence unreacted substance remains even after the resin has been cured, whereby the surface of a printing plate obtained has a tackiness.

The process for producing a photosensitive resin printing plate is generally carried out in four steps of exposure, development, post-exposure and drying, and the post-exposure is a step of further irradiating the printing plate with an active radiation in order to cure the unreacted substance present in and on the cured plate obtained after the development to thereby increase the mechanical strength of the printing plate and reduce the surface tackiness of the printing plate. However, even the printing plate after the post-exposure step is not necessarily sufficiently free from the surface tackiness.

When a printing plate having a great tackiness is used in printing, there are such problems as poor workability in attaching the plate to and detaching the plate from a plate cylinder, adhesion between plates to each other or attachment of dust to the plates during storing the plates, adhesion of paper powder to the plate during the printing, paper-picking during the printing and the like. In particular, when paper powder adhesion and paper-picking are caused owing to the tackiness of the plate during the printing, it is necessary to discontinue the printing and clean the plate, so that the working efficiency is remarkably decreased.

As a method of solving the above problems, there have been adopted a method in which the photosensitive resin plate is irradiated with an active radiation while the plate is immersed in a liquid during the post-exposure step (a post-exposure-in-water method), a method in which the post-exposure is effected in an inert gas to accelerate the polymerization reaction on the surface of the photosensitive resin layer, a method in which a coating material such as various rubber latexes, saran latex or the like is coated on the photosensitive resin plate to lower the surface tackiness, a method in which an oxidizing agent and a reducing agent are used alone or in admixture to subject the photosensitive resin plate to chemical treatment, a method in which the above methods are combined, and the like. As a kind of coating method, there is proposed a method of removing the surface tackiness in which such a phenomenon is utilized that when a specific compound having a higher alkyl group is previously incorporated into the photo-sensitive resin composition the compound is deposited as crystals on the surface of the printing plate after the plate-making (JP-A-61-120,142).

However, these methods are insufficient in the effect per se, or though in some cases they have any effect, the handling of reagents used becomes a problem. Specifically, (1) the coating method is disadvantageous in that the coating layer is peeled off during the printing, and is insufficient in maintenance of the effect. (2) With some kinds of photosensitive resin compositions, even when the post-exposure is effected in an atmosphere from which oxygen is intercepted such as in a liquid or in an inert gas (referred to hereinafter as the poor oxygen post-exposure), the tackiness removal is insufficient in some cases. (3) In the treatment method using an oxidizing agent and a reducing agent, in general, it is necessary to pay attention to the handling of reagents used and to subject the apparatus contacting the treating solution to rust prevention processing.

In particular, the poor oxygen post-exposure (2) is a method intending that by intercepting oxygen and efficiently carrying out the radical polymerization of the polymerizable double bond in the composition, the resulting prepolymer is three-dimensionally cross-linked, thereby increasing the mechanical strength and simultaneously therewith diminishing the unreacted (namely uncross-linked) prepolymer as much as possible to reduce the tackiness. However, when the photosensitive resin composition contains a large amount of such a prepolymer that the number of polymerizable double bonds in one molecule is 2 or less, the printing plate obtained from the photosensitive resin composition can have mechanical strength increased by the poor oxygen post-exposure, but shows insufficient tackiness-removing effect, and when the photosensitive resin composition contains a large amount of such a prepolymer that the number of polymerizable double bonds is more than 2, it is necessary for the printing plate obtained therefrom to be irradiated with an active radiation for a very long time to achieve a sufficient tackiness removing effect.

That is to say, in the plate-making process used at present, it is difficult to allow all the terminal double bonds of the prepolymer to react and even if all of them should have reacted, a plate quite free from tackiness would not be obtained in many cases. Accordingly, in order to more sufficiently remove the tackiness of the photosensitive resin composition containing such a prepolymer, it is effective to three-dimensionally cross-link the prepolymer by utilizing the reaction of the double bonds and other means together.

As the three-dimensional cross-linking based on other reactions than the reaction of double bonds, JP-B-56-16,182 discloses a method which comprises abstracting hydrogen from the main chain of a prepolymer which has reacted with another prepolymer or the unreacted monomer at the terminal double bonds, thereby producing a radical of the prepolymer, and then cross-linking the main chains of the prepolymers with one another through the reaction of the said radicals. Specifically, the surface layer of a radically polymerizable resin cured product is impregnated with a hydrogen-abstracting agent which can abstract a hydrogen atom from a compound upon irradiation with an active radiation and thereafter the impregnated portion of the cured product is irradiated with an active radiation having a wavelength of 300 nm or less, preferably 200 to 300 nm, thereby removing the surface tackiness of the radically polymerizable resin cured product.

JP-B-56-16,182 illustrates, as specific examples of impregnating the surface layer of the radically polymerizable resin cured product with a hydrogen-abstracting agent, a method comprising dissolving of the hydrogen-abstracting agent in ethanol, isopropanol or a water/ethanol (¼) mixture and immersing the cured product in the resulting solution or spraying the surface layer of the cured product with the said solution by means of a sprayer.

However, when the cured product is impregnated with a hydrogen-abstracting agent by the above-mentioned method, the surface tackiness removal effect is sufficiently recognized, but it follows that a separate step of impregnating the plate produced by conventional process with the hydrogen-abstracting agent is required, whereby the number of steps for making a plate is increased and the plate-making process is complicated, to thereby decrease the production yield and require a new equipment, resulting in an increase of the plate-making cost.

Moreover, an organic solvent such as alcohols has a low flash point and hence in the above-mentioned method, the handling of the organic solvent is difficult and such an expensive equipment as an explosion proof type dryer, a forced exhauster or the like becomes necessary.

SUMMARY OF THE INVENTION

The present inventors have made extensive research for solving the above-mentioned problems, and have consequently found that a photosensitive resin printing plate having a tackiness-free surface can be obtained by a series of conventional plate-making steps of exposure, development, post-exposure and drying without an additional step of impregnation by the use of a developer having incorporated thereinto a hydrogen-abstracting agent.

An object of this invention is to provide a developer for a photosensitive resin printing plate which has improved the workability, productivity and handling of reagents in the conventional process for removing the surface tackiness disclosed in JP-B-56-16,182 which utilizes a cross-linking reaction with a hydrogen-abstracting agent, and has realized the more effective removal of the surface tackiness.

Another object of this invention is to provide a process for producing a photosensitive resin printing plate using the above developer.

Other objects and advantages of this invention will become apparent from the following description.

According to this invention, there is provided a developer for a photosensitive resin printing plate which comprises a developing solution and a hydrogen-abstracting agent which can abstract a hydrogen atom from a compound upon irradiation with an active radiation.

This invention also provides a process for producing a photosensitive resin printing plate which comprises developing an exposed photosensitive resin with the above-mentioned developer and then irradiating the surface of the resulting cured plate with an active radiation.

The developer for a photosensitive resin printing plate according to this invention can be handled in quite the same manner as in conventional developing solutions and, in addition, the photosensitive resin printing plate obtained by a plate-making process using the above developer does not exhibit a surface stickiness before, during and after the printing and does not cause such a trouble that foreign particles are attached to the surface of the plate during the printing or in the storing of the plate. Therefore, such a working as cleaning the plate surface or the like is not required. In the process for producing a photosensitive resin printing plate according to this invention, no additional step is required to be added to a series of working steps of a conventional plate-making process, and hence, the plate-making cost is not affected at all by the process of this invention.

DESCRIPTION OF THE PREFERRED EMBODIMENTS

The photosensitive resin to which this invention can be applied is not critical, and preferable typical examples thereof include the following (1) and (2):

(1) Photosensitive resin compositions each comprising a prepolymer having at least one polymerizable double bond in the molecule, a photopolymerization initiator and an ethylenically unsaturated monomer having a polymerizable double bond. The prepolymer is, for example, at least one member selected from the group consisting of an unsaturated polyester, an unsaturated polyurethane, an unsaturated polyamide, an unsaturated polyacrylate, an unsaturated polymethacrylate and various modifications thereof. The above-mentioned photosensitive resin compositions include those stated in JP-A-1-245,245 and JP-A-55-034,930.

(2) Photosensitive rubber compositions each comprising an unvulcanized rubber, a monomer having an ethylenic double bond and a photopolymerization initiator, which are so-called photosensitive elastomers. The photosensitive rubber composition includes, for example, the photosensitive resin compositions mentioned in JP-A-5-134,410.

The developer for a photosensitive resin printing plate which is one aspect of this invention is explained in detail below.

The component other than the hydrogen-abstracting agent in the present developer for a photosensitive resin printing plate is a developing solution for a photosensitive resin (referred to merely as the developing solution in some places of the specification) and may be any developing solution as far as it plays the original role as a developing solution that it washes out the uncured portion without eroding the cured portion. The developing solution for a photosensitive resin includes, for example, those which can dissolve, emulsify or swell the uncured resin portion such as water, an aqueous surfactant solution, an aqueous alkali solution, an organic solvent, a chlorine-containing solvent and the like.

The hydrogen-abstracting agent used in this invention includes organic carbonyl compounds which can be excited upon irradiation with an active radiation to abstract a hydrogen atom from the other compounds. In particular, such organic carbonyl compounds are appropriate as to exhibit the hydrogen-abstracting reactions in which the excited carbonyl group participates, with the same reactivity as or a higher reactivity than the reactivity of a reaction other than the hydrogen-abstracting reactions, such as the Norrish reaction 1 that a carbonyl compound is split in the $\alpha$-position under irradiation with a light or the Norrish reaction 2 that a ketone having hydrogen to be abstracted at the $\gamma$-position of the carbonyl group is split under irradiation with a light into an olefin and a lower molecular weight ketone compound.

Typical organic carbonyl compounds which can be used as a hydrogen-abstracting agent in this invention include, for example, substituted or unsubstituted benzophenones such as benzophenone, methyl o-benzoylbenzoate, 4-phenylbenzophenone, 4-chlorobenzophenone, 4-hydroxybenzophenone, 4-benzoyl-4'-methyldiphenyl sulfide, 3,3'-dimethyl-4-methoxybenzophenone, 4,4'-dichlorobenzophenone, 4-methylbenzophenone and 4,4'-dimethoxybenzophenone; substituted or unsubstituted acetophenones such as acetophenone, 4-methylacetophenone, 2,4- or 3,5-dimethylacetophenone, 4-methoxyacetophenone, 2-chloro-2-phenylacetophenone, 3,4-dichloroacetophenone, 4-hydroxyacetophenone and the like; substituted or unsubstituted aromatic ketones such as benzoin, benzoin alkyl ether compounds (e.g. benzoin methyl ether, benzoin ethyl ether, benzoin isopropyl ether, benzoin isobutyl ether), deoxybenzoin, benzyl dimethyl ketal, benzil, 2-naphthyl phenyl ketone and dibenzosuberone; various o,p-quinone compounds such as 1,4-benzoquinone, 2,6-dimethyl-1,4-benzoquinone, 2,6-dichloro-1,4-benzoquinone, anthraquinone, 2-chloroanthraquinone, 2-methylanthraquinone, 2-ethylanthraquinone, 1,4-naphthoquinone, 2,3-dichloro-1,4-naphthoquinone, 2,3-dimethyl-1,4-naphthoquinone, 2-ethyl-1,4-naphthoquinone, phenanthrenequinone, 1,2-naphthoquinone and camphorquinone; substituted or unsubstituted thioxanthones such as thioxanthone, 2-chlorothioxanthone, 2-methylthioxanthone, 2-isopropylthioxanthone, 2,4-dichlorothioxanthone, 2,4-dimethylthioxanthone and 2,4-diethylthioxanthone; and the like.

Preferably, the organic carbonyl compound has at least one substituted or unsubstituted aromatic ring bonded to the carbonyl carbon. Organic carbonyl compounds having a structure represented by the following formula (I) or (II) are effective as the hydrogen-abstracting agent in this invention:

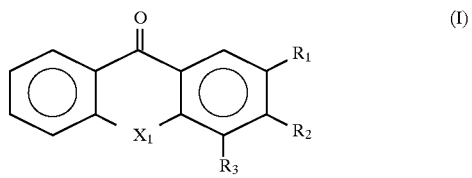

wherein $X_1$ represents sulfur (—S—), a carbonyl group (—CO—) or an ethylene group (—CH$_2$—CH$_2$—); $R_1$, $R_2$ and $R_3$ may be the same as or different from one another and each represents a hydrogen atom, an alkyl group having 1 to 5 carbon atoms, an alkoxyl group having 1 to 5 carbon atoms, a halogen atom selected from the group consisting of F, Cl, Br and I, a hydroxyalkyl group having 1 to 5 carbon atoms or a hydroxyalkoxyl group having 1 to 5 carbon atoms,

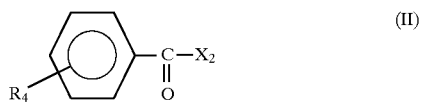

wherein $R_4$ represents a hydrogen atom, a halogen atom selected from the group consisting of F, Cl, Br and I, an alkoxyl group having 1 to 5 carbon atoms, a hydroxyl group, an alkyl group having 1 to 5 carbon atoms, a hydroxyalkyl group having 1 to 5 carbon atoms or a hydroxyalkoxyl group having 1 to 5 carbon atoms; and $X_2$ represents a substituted or unsubstituted benzoyl, phenyl or naphthyl group represented, respectively, by the general formula (III), (IV) or (V):

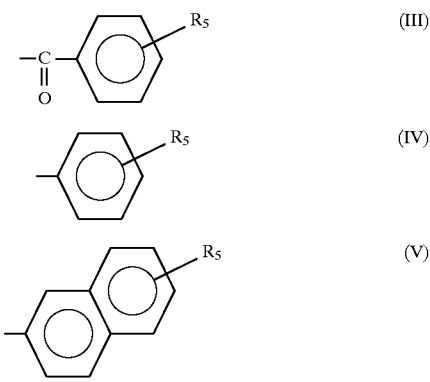

wherein $R_5$ represents a halogen atom selected from the group consisting of F, Cl, Br and I, a hydrogen atom, an alkyl group having 1 to 5 carbon atoms, an alkoxyl group having 1 to 5 carbon atoms, a hydroxyalkyl group having 1 to 5 carbon atoms or a hydroxyalkoxyl group having 1 to 5 carbon atoms. The compounds represented by the formulas (I) and (II) may be used alone or in combination of two or more.

Specific examples of such compounds include benzophenone, 4,4'-dimethoxybenzophenone, 4-hydroxybenzophenone, anthraquinone, 2-methylanthraquinone, 2-ethylanthraquinone, 2,4-diethylthioxanthone, 2-chlorothioxanthone and the like.

As derivatives of the compound represented by the formula (I) or (II), those having a polymerizable double bond and those containing an ammonium salt moiety can also be used as the hydrogen-abstracting agent in this invention.

The ammonium salt moiety-containing derivatives of the compound represented by the formula (I) or (II) include (2-acryloyloxy)ethyl(4-benzoylbenzyl)dimethylammonium bromide, (4-benzoylbenzyl)trimethylammonium chloride, 2-(3-dimethylamino-2-hydroxypropoxy)-3,4-dimethyl-9H-thioxanthon-9-one mesochloride and the like. Among them, benzophenone is most effective in respect of dispersion and hydrogen-abstracting effect per unit weight.

In order that one of the effects of this invention which is to obtain a tack-free photosensitive resin printing plate is sufficiently exerted, it is necessary that in the step of developing with a hydrogen-abstracting agent-containing developing solution for a photosensitive resin, the hydrogen-abstracting agent be attached to and impregnated into the surface of the cured resin in the photosensitive resin printing plate. For this purpose, it is preferable that the hydrogen-abstracting agent is dispersed in the developing solution.

The state that the hydrogen-abstracting agent is dissolved in the developing solution is optimum; however, the desired effect can be exerted as far as the hydrogen-abstracting agent is uniformly dispersed in the suspension state in the developer. The suspension state in which the hydrogen-abstracting agent is uniformly dispersed means the state that the necessary amount of the hydrogen-abstracting agent is floated and suspended without being settled, more particularly, the state that the necessary amount of the hydrogen-abstracting agent does not form a precipitate for at least 24 hours at the appropriate developing temperature. The smaller the particle size of the hydrogen-abstracting agent particles in the suspension state, the higher the efficiency of impregnation of the cured resin surface with the hydrogen-abstracting agent, and the particle size is desirably $10^{-5}$ cm or less though it is not critical.

In the state that the hydrogen-abstracting agent is not uniformly dispersed in the developer, that is, in the state that the hydrogen-abstracting agent is settled in the bath of a developing machine and the necessary amount of the hydrogen-abstracting agent is not maintained in the dispersion state, the hydrogen-abstracting agent resident in the bottom of the bath of the developing machine does not participate in the attachment to and impregnation of the surface layer of the cured resin portion and hence the tackiness-removing effect becomes insufficient. When the developing machine is a spray type developing machine, the nozzle portion is blocked with the crystallized hydrogen-abstracting agent, whereby the spray pressure is reduced, resulting in a trouble of the machine.

When the hydrogen-abstracting agent is dissolved or uniformly dispersed in the developing solution, the hydrogen-abstracting agent is introduced as it is into the developing solution and mixed therewith. It is also possible to take a part of the developing solution, mix the same with the hydrogen-abstracting agent and then introduce the resulting mixture into the remaining developing solution.

However, many hydrogen-abstracting agents are solid at 10° to 20° C., and even if they are liquid, many of them are not dissolved or uniformly dispersed particularly in aqueous developing solutions. In the case of developing solutions poor in ability to dissolve or uniformly disperse the hydrogen-abstracting agent as mentioned above, it is necessary to change the compositions of the developing solutions or add a dispersing adjuvant to the developing solutions to thereby improve the ability of the developing solutions to dissolve or uniformly disperse the hydrogen-abstracting agent. In particular, in the case of an aqueous developing solution characterized by having no flash point in the temperature range of 20° to 60° C. abstracting in which the developer is used, the use of a surfactant which can emulsify the hydrogen-abstracting agent is effective.

When it is difficult to mix the hydrogen-abstracting agent per se with the developing solution to prepare a solution or a uniform dispersion, it is preferable that the hydrogen-abstracting agent is previously treated so that the hydrogen-abstracting agent becomes a solution state or a uniform dispersion state in the developing solution.

As a mixing method for allowing the hydrogen-abstracting agent to become a solution state or a uniform dispersion state in the developing solution, there are mentioned, for example, (1) a method in which the hydrogen-abstracting agent is previously heated to its melting point to be made liquid and then introduced into and mixed with the developing solution; (2) a method in which solids of the hydrogen-abstracting agent are previously subjected to mechanical pulverization such as by means of a mixer or the like and the resulting very fine particles are introduced into and mixed with the developing solution; (3) a method in which the hydrogen-abstracting agent is dissolved in a solvent having an ability to dissolve both hydrogen-abstracting agent and developing solution to prepare a solution of the hydrogen-abstracting agent in the solvent and then the solution is introduced into and mixed with the developing solution; (4) a method in which a solution or uniform dispersion of the hydrogen-abstracting agent is previously prepared using a surfactant enabling the hydrogen-abstracting agent to be dissolved or uniformly dispersed in a medium and then the resulting solution or uniform dispersion is introduced into and mixed with the developing solution; and the like.

The aqueous developing solution is general as a developing solution for a liquid photosensitive resin, contains 1 to 5% of a surfactant and is prepared by diluting with water a previously prepared original solution comprising a surfactant as the main reagent, said original solution being called "washing-out agent", and, if necessary, adding an adequate amount of a defoaming agent thereto.

When the solubility or dispersibility of the hydrogen-abstracting agent in a washing-out agent for use in preparation of a developing solution is good, as a variation of the above-mentioned mixing method (4), the developer may be prepared by previously, dissolving or uniformly dispersing a determined amount of the hydrogen-abstracting agent in the washing-out agent and then diluting the resulting washing-out agent. According to this method, it is possible to omit the step of adding the hydrogen-abstracting agent per se or its solution or dispersion from the process of preparing a developer, and it becomes possible to prepare the hydrogen-abstracting agent-containing developer of this invention by a conventional method for prepare a developing solution, that is, by dilution of a washing-out agent. Therefore, said method is excellent in workability and need not use an organic solvent having a low flash point, so that the above method is advantageous in respect of handling of reagents and working circumstances.

In this invention, the attachment of the hydrogen-abstracting agent to and impregnation therewith of the surface layer of a cured resin are conducted in a development step, so that the impregnation conditions are varied depending upon the developer temperature, the amount of the hydrogen-abstracting agent contained in the developer and the developing time.

The developer temperature is not critical and may be the developing temperature determined based on the developability in a conventional plate-making step. When the developer temperature is elevated, the solubility or uniform dispersibility of the hydrogen-abstracting agent in the developing solution is generally enhanced; the degree of swelling of the surface of the cured resin portion becomes large; and the amount of the hydrogen-abstracting agent impregnated becomes large, so that the surface tackiness-removing effect is increased. In order to obtain a stabilized tackiness-removing effect on the plate surface, the developer temperature is preferably maintained at 20° to 60° C.

In the method for removing the surface tackiness comprising an impregnation step consisting of immersion of a plate as stated in JP-B-56-16,182, the tackiness-removing effect has been able to be controlled by the optimization of the immersion time and the concentration of the hydrogen-abstracting agent. However, in this invention, the developing time is the same as the time for impregnating the cured resin portion with the hydrogen-abstracting agent, so that it follows that the content of the hydrogen-abstracting agent is controlled for controlling the surface tackiness-removing effect without changing the developing time. Accordingly, in this case, the developing time may be the necessary time for sufficiently washing out the unexposed resin. For example, the general developing time for a photosensitive resin printing plate having a thickness of 5 to 7 mm is 5 to 10 minutes.

The optimum content of the hydrogen-abstracting agent in the developer may be varied depending upon the kind of the photosensitive resin composition, the kind of the hydrogen-abstracting agent, the developing temperature, the developing time, the developing method (spray, brush or the like and the change in developing conditions depending thereon) and the like; however, for obtaining a sufficient surface tackiness-removing effect, the content is 0.01 to 10 parts by weight, preferably 0.05 to 10 parts by weight, per 100 parts by weight of the developer. When the content is less than 0.01 part by weight, the surface tackiness-removing effect is not sufficient, and when the content exceeds 10 parts by weight, the surface tackiness-removing effect is not increased any more and, in addition, the load applied to the developer becomes large, whereby the developability is adversely affected.

In order to obtain the tackiness-free, photosensitive resin printing plate of this invention, it is necessary that:

(1) the photosensitive resin exposed to light be developed with the hydrogen-abstracting agent-containing developer, and (2) after the development, the cured plate obtained be irradiated with an active radiation to activate (excite) the hydrogen-abstracting agent, thereby causing a hydrogen-abstracting reaction.

According to this invention, these two operations need not be provided as additional steps, and can be carried out in the four steps of exposure, development, post-exposure and drying which are general as the conventional steps for producing a photosensitive resin printing plate, and no improvement of apparatus is required. This invention has such an beneficial effect.

In this invention, the impregnation of the surface layer of the cured resin with the hydrogen-abstracting agent is conducted in the development step because it can be expected that not only the developing step is unified with the impregnating step, namely the steps are simplified, but also the affinity of the developer for the resin enables the impregnation with the hydrogen-abstracting agent to be more effectively practiced. The details of the mechanism are not clear from the results; however, as compared with the method stated in JP-A-56-16,182, the surface tackiness-removing effect is increased by the chemical properties of the developer.

Next, a detailed explanation is made of the process for producing a photosensitive resin printing plate which is another aspect of this invention. This production process comprises developing the exposed photosensitive resin with the hydrogen-abstracting agent-containing developer and thereafter irradiating the surface of the obtained cured plate with an active radiation.

In general, the process for producing a photosensitive resin printing plate, when a liquid photosensitive resin is used, consists of a series of an exposure step, a development (washing-out) step, a post-exposure step and a drying step, and when a solid (sheet-like) photosensitive resin is used, the production process consists of a series of an exposure step, a development (washing-out) step, a drying step and a post-exposure step. The step of exposing the liquid photosensitive resin to a light is carried out along with a molding operation for controlling the liquid resin to a given thickness. An apparatus for conducting the molding and exposure of such a liquid photosensitive resin is called a plate-making machine.

The step of exposing to light a printing plate for letterpress printing in which a liquid photosensitive resin is used consists of carrying out the following steps successively: (1) a molding step consisting of placing a negative film on an ultraviolet-permeable glass plate, covering the same with a thin protective film, thereafter pouring the liquid photosensitive resin thereon, then laminating thereto a base film which becomes a support through such a spacer that the resulting printing plate has a given thickness, and further pressing the resulting assembly from above with an ultraviolet-permeable glass plate, (2) a relief exposure step consisting of irradiating the assembly with an active radiation (having a wavelength distribution at 300 nm or more) obtained from an ultraviolet fluorescent lighting as a light source through the negative film from the lower glass plate side to form a printing image and (3) a back exposure step consisting of irradiating the assembly with the same active radiation as in (2) above from the upper glass plate side through the support for a short time to form a uniform, thin, cured resin layer, namely a bottom-forming layer (a back layer) over the whole surface of the support side of the plate.

When the printing plate has a thickness of 4 mm or more as used in the flexographic printing, it is necessary to form a shelf layer which becomes a base for supplementing the strength of the relief to the printing pressure during printing. In this case, it is necessary to effect a masking exposure using an exclusive negative film from the upper glass plate side before the relief exposure.

In the exposure step in which a solid (sheet-like) photosensitive resin is used, the sheet is a composite structure consisting of a protective film layer, a protective membrane layer, a photosensitive resin layer molded in a given thickness and a base film (support) layer, and hence, the exposure step consists of carrying out successively (1) a back exposure step in which the solid (sheet-like) photosensitive resin is placed on an ultraviolet permeable glass plate so that the support side contacts the glass plate and the resulting assembly is irradiated with an active radiation whose source is an ultraviolet fluorescent lighting from the lower glass plate side and (2) a relief exposure step in which a negative film is intimately attached onto the protective membrane which has appeared by peeling off the protective film from the assembly and an active radiation is applied to the assembly from above through the negative film as in (1) above.

The above-mentioned exposure step is merely an example of a method which has been generally carried out, and the exposure step in this invention may be any system as far as it requires development with a developing solution after the exposure.

The development step in this invention is characterized by using the above-mentioned hydrogen-abstracting agent-containing developer. However, as the developing method, there may be applied a conventional developing method.

The conventional developing method includes, for example, a method in which the exposed photosensitive resin plate is immersed in a developing solution; a method in which the developing solution is sprayed from a spray nozzle onto the exposed photosensitive resin plate surface and the uncured resin is dissolved therein and removed from the plate; a method in which the uncured resin swollen by the immersion or spraying is scraped with a brush; and the like, and all the known techniques concerning a wet development of a photosensitive resin can be applied to this invention.

In this invention, the developed cured resin plate is irradiated with an active radiation to excite the hydrogen-abstracting agent. Generally, it is desirable to conduct this irradiation during the post-exposure step in the plate-making process; however, when the post-exposure step in the plate-making process does not satisfy the active radiation conditions mentioned below, a separate, appropriate, active radiation-irradiating step must be added.

The active radiation with which the cured resin plate developed with the hydrogen-abstracting agent-containing developer is irradiated may be one having a wavelength in the wavelength region in which the hydrogen-abstracting agent can be excited with a good efficiency, and is not critical. When the above-mentioned organic carbonyl compound is used as the hydrogen-abstracting agent, it is particularly preferable to use an ultraviolet ray having a wavelength distribution in a short wavelength region of 300 nm or less. However, when an active radiation having a wavelength of 200 nm or less is applied in air, the generation of ozone and oxidation reaction of the cured resin cannot be neglected, so that an active radiation having a wavelength distribution in a wavelength region of 200 to 300 nm is more preferable. Such a light source includes, for example, a low pressure mercury vapor lamp, a germicidal lamp, a heavy hydrogen lamp and the like.

The post-exposure step in a process for producing a printing plate using a liquid photosensitive resin is a step of irradiation of the cured resin plate after the development with an active radiation aiming mainly at improving the mechanical strength and removing the surface tackiness. In this step, there are many cases in which an active radiation source having a wavelength distribution in a wavelength region of 300 nm or more (for example, a high pressure mercury vapor lamp, a super high pressure mercury vapor lamp, an ultraviolet fluorescent lighting, a carbon-arc lamp, a xenon lamp or the like) is used in combination with an active radiation source having a wavelength distribution in a wavelength region of 200 to 300 nm, so that it is possible to conduct the irradiation with an active radiation for exciting the hydrogen-abstracting agent during the post-exposure step and it is preferable in view of productivity.

In the post-exposure step in the process for producing a printing plate using the solid (sheet-like) photosensitive resin, it is general to conduct the irradiation with an active radiation having a wavelength distribution in a wavelength region of 200 to 300 nm for the purpose of removing the surface tackiness, so that it is possible to conduct the irradiation with an active radiation for exciting the hydrogen-abstracting agent during the post-exposure step similarly to the above case, and it is preferable in view of the productivity.

The irradiation with the active radiation may be effected by an exposure-in-water system for preventing the polymerization from being inhibited by oxygen in air, or may be effected by an exposure-in-air system without any special measure for the inhibition by oxygen.

However, in the case of the printing plate obtained by irradiation with an active radiation by the exposure-in-air system, the tackiness is sufficiently removed on the surface of a printing image portion to be used in printing, namely the convex portion obtained by the relief exposure, but is not sufficiently removed on the surface of a shelf layer (formed for printability and handling of plate) or a back layer (formed by exposure from the support side) in some cases. In particular, this tendency is remarkable in the case of a liquid photosensitive resin.

The degree that the surface tackiness of the shelf layer or the back layer causes attachment of paper powder, paper picking or the like is small and a practically usable printing plate can be obtained by the exposure-in-air system; however, the exposure-in-water system is more desirable for removing the tackiness throughout the printing plate surface.

The appropriate exposure dose for obtaining a sufficient surface tackiness-removing effect may be varied depending upon the composition of the cured resin plate, the kind of the hydrogen-abstracting agent and the amount of the hydrogen-abstracting agent impregnated into the resin; however, at least 500 mJ/cm$^2$ [a value calculated from the irradiation time when the irradiation dose at a wavelength of 250 nm is measured by an ultraviolet radiation dosimeter manufactured by ORC Seisakusho (UV-M02)] is necessary, and it is preferably 1,000 to 5,000 mJ/cm$^2$, more preferably 1,000 to 3,000 mJ/-cm$^2$. When it exceeds 5,000 mJ/cm$^2$, slight cracks are caused on the plate surface, so that said exposure dose is not desirable.

In the drying step, it is sufficient to dry the plate until the water content on the plate surface becomes nil, and the temperature, time and system are not particularly limited.

The evaluation of tackiness of the surface of a printing plate was conducted by contacting a polyethylene film laminated to the peripheral surface of an aluminum ring having a diameter of 50 mm and a width of 13 mm with the relief surface layer, allowing the resulting assembly to stand under a load of 500 g applied to the aluminum ring for 4 seconds, thereafter pulling up the aluminum ring at a rate of 30 mm per minute and reading the tack when the aluminum ring separates from the relief surface by a push-pull gauge using a tack tester (manufactured by Toyo Seiki Co., Ltd.). When the value read using a tack tester (referred to hereinafter as the tack value) is smaller, the printing plate can be said to have a smaller surface tackiness. However, when a permanent tackiness is evaluated, the tackiness of the photosensitive resin substrate must be measured in the state that the printing plate is freed from a coating layer which peels away during printing, namely, after a compound for the purpose of removing the surface tackiness contained in the photosensitive resin, if any, has been removed.

When the tack value exceeds about 50 g, foreign particles attach to the surface of a printing plate, and the printed matter becomes unacceptable, and when the tack value exceeds 100 g, printing plates placed on one another adhere to one another and when the substrate to be printed is paper, a paper picking phenomenon is caused by the tack between the printing surface and the paper. As a good printing plate, the tack value is desirably 0 g; however, when the tack value is not more than 30 g, it is considered that no problem due to tackiness could be caused in practical use. In the case of a liquid photosensitive resin printing plate which is considered to be particularly unsatisfactory in view of tackiness among printing plates, when no measure for removing the surface tackiness has been taken, it is general that the tack value exceeds 100 g.

Examples are shown below to explain this invention in more detail; however, they are merely illustrative and not limitative.

EXAMPLE 1

A photosensitive resin composition obtained in the same manner as in Example 1 of JP-A-1-245,245 (referred to hereinafter as the liquid photosensitive resin A, in which a polyether type unsaturated polyurethane polymer was used) was subjected to treatments until the exposure step using a Model ALF-213E plate-making machine (manufactured by Asahi Kasei Kogyo Kabushiki Kaisha) to prepare a 7-mm plate. The exposure dose was such appropriate exposure conditions that a relief depth of 2 mm, a shelf layer of 5 mm thick, a back layer of 1 mm thick and a 3%-65 lines/inch reproduction were made possible.

Benzophenone was dissolved at a concentration of 3.5 wt % in APR (registered trademark) washing-out agent [Type W-8 (main reagent: anionic surfactant) manufactured by Asahi Kasei Kogyo Kabushiki Kaisha] capable of emulsifying the liquid photosensitive resin A to prepare WZ-8 (another washing-out agent).

In the developer bath (70 liters) of Model AL-400W developing machine (a drum rotary spray system, manufactured by Asahi Kasei Kogyo Kabushiki Kaisha), the WZ-8 was diluted with water to a concentration of 2 wt %, and a defoaming agent [SH-4 (silicone mixture manufactured by Asahi Kasei Kogyo Kabushiki Kaisha)] was added thereto in a proportion of 0.3 wt % to prepare a developer. As a result, 0.07 wt % of benzophenone was contained in the developer.

The temperature of the thus prepared developer was adjusted to 40° C. and thereafter the 7-mm plate consisting of the liquid photosensitive resin A which had been subjected to treatments until the exposure step was developed with the above developer for 10 minutes.

Subsequently, the developed plate was washed with a tap water to such an extent that bubbles resulting from the developer were removed, and thereafter, subjected to post-exposure in water using Model ALF-200UP post-exposing machine (manufactured by Asahi Kasei Kogyo Kabushiki Kaisha) using an ultraviolet fluorescent lighting and a germicidal lamp both in an exposure dose of 2,500 mJ/cm$^2$.

Thereafter, the plate was dried in Model AL-100P drier (manufactured by Asahi Kasei Kogyo Kabushiki Kaisha) until the water content on the plate surface became nil for about 30 minutes, after which the dried plate was allowed to stand in a constant temperature chamber at 20° C. overnight to obtain a printing plate.

The printing image surface to be used in printing of the resulting liquid photosensitive resin A printing plate (the printing image surface is hereinafter referred to as the printing portion) was violently wiped with a fabric infiltrated with ethyl alcohol, and after the volatilization of ethyl alcohol, the tackiness of the plate surface was measured by the above-mentioned method, to find that the tack value was 0 g. It was also confirmed by feel evaluation that the back layer had no tackiness.

EXAMPLE 2

In the same manner as in Example 1, a 7-mm plate which had been subjected to treatments until the exposure step was prepared using a photosensitive resin composition obtained in the same manner as described in Example 3 of JP-A-3-157,657 [ the said photosensitive resin composition is referred to hereinafter as the liquid photosensitive resin B (polyether/polyester type unsaturated polyurethane polymer was used)].

Since the W-8 prepared in Example 1 was a washing-out agent capable of emulsifying the liquid photosensitive resin B, too, a 2 wt % aqueous WZ-8 solution was used as the developer and development, post-exposure in water and drying were conducted in the same manner as in Example 1 to obtain a printing plate.

The surface of the printing portion of the liquid photosensitive resin B printing plate obtained was wiped with a fabric infiltrated with ethyl alcohol and thereafter the tackiness thereof was measured by the above-mentioned method to find that the tack value was 20 g.

EXAMPLE 3

A 3-mm plate which had been subjected to treatments until the exposure step was prepared using a photosensitive resin composition obtained in the same manner as in Example 1 of JP-B-55-034,930 [the said photosensitive resin composition is referred to hereinafter as the liquid photosensitive resin C (1,2-hydrogenated polybutadiene type unsaturated polyurethane polymer was used)] in the Model ALF-213E plate-making machine. The exposure dose was such optimum exposure conditions that a relief depth of 2 mm, a back layer of 1 mm thick and a 3%-100 lines/inch reproduction were possible.

Benzophenone was dissolved at a concentration of 5 wt % in an APR washing-out agent [Type W-6 (main reagent: a combination of nonionic surfactant with anionic surfactant), manufactured by Asahi Kasei Kogyo Kabushiki Kaisha] capable of emulsifying the liquid photosensitive resin C to prepare WZ-6 (another washing-out agent).

In the developer bath (70 liters) of a Model AL-400W developing machine, the WZ-6 was diluted with water to a concentration of 2 wt %, and the defoaming agent SH-4 was added thereto in a proportion of 0.3 wt % to prepare a developer. As a result, 0.1 wt % of benzophenone was contained in the developer.

Using the developer having the above-mentioned composition (a 2 wt % aqueous solution of WZ-6), a 3-mm plate consisting of the liquid photosensitive resin C which had been subjected to molding and exposure was developed, post-exposed and dried in the same manner as in Example 1 to obtain a printing plate.

The surface of the printing portion of the liquid photosensitive resin C printing plate obtained was wiped with a fabric infiltrated with ethyl alcohol and then the tackiness thereof was measured by the above-mentioned method to find that the tack value was 50 g.

EXAMPLE 4

A photosensitive elastomer composition obtained in the same manner as in Example 1 of JP-A-5-134,410 was molded into a sheet [referred to hereinafter as the sheet-like photosensitive resin D (styrene/butadiene copolymer was used, a 2.84-mm plate)] and the sheet-like photosensitive resin D was exposed under such exposure conditions that the highlight formation of a relief depth of 2 mm and a 3%-100 lines/inch reproduction were made possible.

Subsequently, using a solution prepared by dissolving 0.3 wt % of benzophenone in a tetrachloroethylene/n-butyl alcohol (3/1) mixture, the unexposed portion of the sheet-like photosensitive resin D was washed out (developed) by use of a brush, and the sheet-like photosensitive resin D thus obtained was dried at 60° C. for 1 hour, and then allowed to stand at room temperature overnight, after which it was subjected to post-exposure in an exposure dose of 1,000 mJ/cm$^2$ in a post-exposing apparatus whose light source was a germicidal lamp to obtain a printing plate. The plate-making process was carried out by use of an AFP 1500 system (trademark; manufactured by Asahi Kasei Kogyo Kabushiki Kaisha).

The surface of the printing portion of the sheet-like photosensitive resin D printing plate obtained was wiped with a fabric infiltrated with ethyl alcohol and then the tackiness thereof was measured by the above-mentioned method to find that the tack value was 30 g.

EXAMPLE 5

A printing plate was prepared in the same manner as in Example 1, except that a solution prepared by adding 150 g of (4-benzoylbenzyl)trimethylammonium chloride to an aqueous solution (70 liters) containing 2 wt % of the washing-out agent W-8 and 0.3 wt % of the defoaming agent SH-4 was used as the developer.

The surface of the printing portion of the liquid photosensitive resin A printing plate obtained was wiped with a fabric infiltrated with ethyl alcohol and then the tackiness thereof was measured by the above-mentioned method to find that the tack value was 10 g.

EXAMPLE 6

A benzophenone solution in ethanol was previously prepared by dissolving 50 g of benzophenone in 0.5 liter of ethanol.

The benzophenone solution in ethanol obtained above was added to 70 liters of an aqueous solution containing 2 wt % of the washing-out agent WZ-8 and 0.3 wt % of the defaming agent SH-4, to prepare a developer. As a result, this developer contained 0.07 wt % of benzophenone.

The flash point of the developer was measured; however, the developer was boiled at 99° C. and the measurement of flash point was impossible.

In the same manner as in Example 1, except that the above-mentioned developer was used, a printing plate was produced.

The surface of the printing portion of the liquid photosensitive resin A printing plate obtained was wiped with a fabric infiltrated with ethyl alcohol and then the tackiness thereof was measured to find that the tack value was 0 g.

EXAMPLE 7

The plate which had been subjected to treatments until the development step in the same manner as in Example 1 was washed with water to such an extent that the bubbles resulting from the surfactant were removed, and thereafter, subjected to post-exposure in ALF-200UP whose water bath did not contain water using an ultra-violet fluorescent lighting and a germicidal lamp both in an exposure dose of 2,500 mJ/cm$^2$, and then to drying, to obtain a printing plate.

The surface of the printing portion of the liquid photosensitive resin A printing plate obtained was wiped with a fabric infiltrated with ethyl alcohol and then the tackiness thereof was measured to find that the tack value was 10 g.

On the back layer, the tackiness was evaluated by a feel evaluation to find that a part thereof was tacky.

COMPARATIVE EXAMPLE 1

The same procedure as in Example 1 was repeated, except that W-8 which was free from benzophenone was used as the washing-out agent to prepare a printing plate.

The surface of the printing portion of the liquid photosensitive resin A printing plate obtained was wiped with a fabric infiltrated with ethyl alcohol and then the tackiness thereof was then measured to find that the tack value was 100 g.

On the back layer, the tackiness was measured by feel to find that the whole thereof was tacky.

COMPARATIVE EXAMPLE 2

The same procedure as in Example 2 was repeated, except that W-8 which was free from benzophenone was used as the washing-out agent to prepare a printing plate.

The surface of the printing portion of the liquid photosensitive resin B printing plate obtained was wiped with a fabric infiltrated with ethyl alcohol and the tackiness thereof was then measured by the above-mentioned method to find that the tack value was 400 g.

COMPARATIVE EXAMPLE 3

The same procedure as in Example 3 was repeated, except that W-6 which was free from benzophenone was used as the washing-out agent to prepare a printing plate.

The surface of the printing portion of the printing plate obtained was wiped with a fabric infiltrated with ethyl alcohol and then the tackiness thereof was measured to find that the tack value was 410 g.

COMPARATIVE EXAMPLE 4

The same procedure as in Example 4 was repeated, except that a benzophenone-free tetrachloroethylene/n-butyl alcohol (3/1) mixture was used as the developer, to prepare a printing plate.

The surface of the printing portion of the liquid photosensitive resin D printing plate obtained was wiped with a fabric infiltrated with ethyl alcohol and then the tack value was measured by the above-mentioned method to find that the tack value was 70 g.

COMPARATIVE EXAMPLE 5

The same procedure as in Example 1 was repeated, except that in the post-exposure in water using ALF-200UP, the irradiation with an active radiation from the germicidal lamp as the light source was not conducted and the post-exposure was conducted using only an ultra-violet fluorescent lighting, to prepare a printing plate.

The surface of the printing portion of the liquid photosensitive resin A printing plate obtained was wiped with a fabric infiltrated with ethyl alcohol and then the tack value was measured by the above-mentioned method to find that the tack value was 420 g.

COMPARATIVE EXAMPLE 6

A plate which had been subjected to treatments until the development step in the same manner as in Comparative Example 1 was washed with tap water to such an extent that bubbles resulting from the surfactant were removed, and then dried using AL-100P until the water content on the plate surface became nil. Thereafter, in ALF-200UP whose water bath did not contain water, the post-exposure was carried out using an ultraviolet fluorescent lighting and a germicidal lamp both in an exposure dose of 2,500 mJ/cm$^2$, to obtain a printing plate.

The surface of the printing portion of the liquid photosensitive resin A printing plate obtained was wiped with a fabric infiltrated with ethyl alcohol and then the tackiness thereof was measured to find that the tack value was 230 g.

On the back layer, the tackiness was measured by a feel evaluation to find that the whole thereof was tacky.

COMPARATIVE EXAMPLE 7

A plate which had been subjected to treatments until the development in the same manner as in Compara- tive Example 1 was immersed in a 0.7 g/liter benzophenone solution in ethyl alcohol warmed at 40° C. for 10 minutes and then allowed to stand at room temperature until the ethyl alcohol on the plate surface had been volatilized. Thereafter, in ALF-200UP whose water bath did not contain water, the post-exposure was carried out using an ultra-violet fluorescent lighting and a germicidal lamp both in an exposure dose of 2,500 mJ/cm$^2$, to obtain a printing plate.

The surface of the printing portion of the liquid photosensitive resin A printing plate obtained was wiped with a fabric infiltrated with ethyl alcohol and then the tackiness thereof was measured by the above-mentioned method to find that the tack value was 410 g.

On the back layer, the tackiness was measured by a feel evaluation to find that it was so tacky that the tacky uncured material was attached to hand.

COMPARATIVE EXAMPLE 8

The same procedure as in Comparative Example 7 was repeated, except that the concentration of benzophenone/ethyl alcohol solution was changed to 10 g/liter, to prepare a printing plate.

The surface of the printing portion of the liquid photosensitive resin A printing plate obtained was wiped with a fabric infiltrated with ethyl alcohol and then the tackiness thereof was measured by the above-mentioned method to find that the tack value was 300 g.

On the back layer, the tackiness was measured by a feel evaluation to find that the whole thereof was tacky.

COMPARATIVE EXAMPLE 9

The plate obtained in Comparative Example 1 was immersed in a 10 g/liter benzophenone solution in ethyl alcohol warmed at 40° C. for 10 minutes, and then allowed to stand at room temperature until the ethyl alcohol on the plate surface had been volatilized. Thereafter, in ALF-200UP whose water bath did not contain water, the exposure was conducted using a germicidal lamp in an exposure dose of 1,000 mJ/cm$^2$ to obtain a printing plate.

The surface of the printing portion of the liquid photosensitive resin A printing plate obtained was wiped with a fabric infiltrated with ethyl alcohol, and then the tackiness thereof was measured by the above-mentioned method to find that the tack value was 0 g.

On the back layer, the tackiness was measured by a feel evaluation, to find that it was not tacky.

According to the above method, the surface tackiness-removing effect is sufficiently exerted; however, such surface treating steps as plate immersion, drying and irradiation with a germicidal light are required in addition to the series of plate-making steps, so that the palate-making time is greatly affected. As the immersion solvent, an organic solvent (the flash point of ethanol is 13° C.) is used, so that there is required a great improvement of a practical plate-making equipment such as making the equipment explosion-proof, installation of various gas-exhausting means and the like from the viewpoints of handling and working circumstances.

COMPARATIVE EXAMPLE 10

A plate obtained in the same manner as in Comparative Example 1 was immersed in a 10 g/liter benzophenone solution in a water/ethyl alcohol (1/1) mixture warmed at 40° C. for 10 minutes, and then dried in AL-100P until the water content on the plate surface had been volatilized. Thereafter, in ALF-200UP whose water bath did not contain water, the exposure was conducted using a germicidal lamp in an exposure dose of 1,000 mJ/cm$^2$ to obtain a printing plate.

The surface of the printing portion of the liquid photosensitive resin A printing plate obtained was wiped with a fabric infiltrated with ethyl alcohol, and then the tackiness thereof was measured by the above-mentioned method to find that the tack value was 10 g.

The flash point of the benzophenone solution in a water/ethyl alcohol mixture was measured to find that it was 25° C.

AL-100P is not of the explosion-proof type and hence is not suitable for drying a solvent having a flash point of 25° C., so that an improvement of the equipment is necessary for using it in a full-scale plate-making process.

Drying by allowing to stand at room temperature was tried but it took at least one hour even though the liquid was sufficiently removed after the immersion. When the exposure is conducted in the insufficiently dried state using a germicidal lamp, the tackiness was not sufficiently removed in the portion to which the liquid was attached and the tack value obtained was about 100 g. On the surface of the printing plate, such a pattern as stain was found on such a level that the appearance became a problem.

The present application relies on priority upon the inventors' Japanese Patent Application No. 08-055,378 filed Feb. 20, 1996, the contents of which are herein incorporated by reference.

What is claimed is:

1. A process for producing a photosensitive resin printing plate, which comprises the steps of developing a photosensitive resin which has been exposed to light, with a composition comprising a developer for a photosensitive resin and a hydrogen-abstracting agent which can abstract hydrogen atoms from a compound upon irradiation with an active radiation, and thereafter, irradiating the surface of an obtained cured plate with an active radiation.

2. The process according to claim 1, wherein the hydrogen-abstracting agent is an organic carbonyl compound.

3. The process according to claim 2, wherein the organic carbonyl compound is at least one member selected from the group consisting of compounds represented by the following formulas (I) and (II):

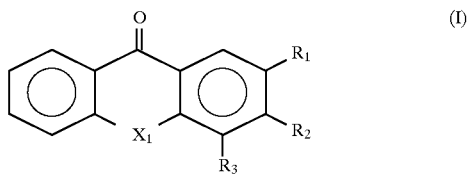

(I)

wherein $X_1$ represents sulfur (—S—), a carbonyl group (—CO—) or an ethylene group (—CH$_2$—CH$_2$—); and $R_1$, $R_2$ and $R_3$ are the same as or different from one another, and each represents a hydrogen atom, an alkyl group having 1 to 5 carbon atoms, an alkoxyl group having 1 to 5 carbon atoms, a hydroxyalkyl group having 1 to 5 carbon atoms, a hydroxyalkoxyl group having 1 to 5 carbon atoms, or a halogen atom selected from the group consisting of F, Cl, Br and I,

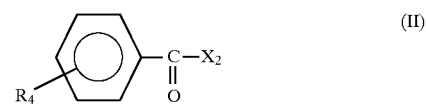

(II)

wherein $R_4$ represents a hydrogen atom, an alkoxyl group having 1 to 5 carbon atoms, a hydroxyl group, an alkyl group having 1 to 5 carbon atoms, a hydroxyalkyl group having 1 to 5 carbon atoms, a hydroxyalkoxyl group having 1 to 5 carbon atoms, or a halogen atom selected from the group consisting of F, Cl, Br and I; and $X_2$ represents a substituted or unsubstituted benzoyl, phenyl or naphthyl group represented, respectively, by the following general formulas (III), (IV) or (V):

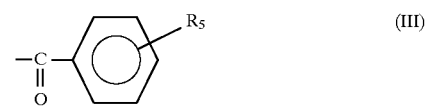

(III)

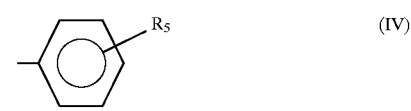

(IV)

-continued
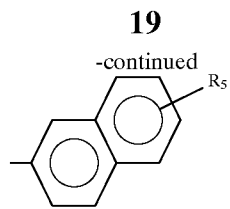
(V)
wherein $R_5$ represents a hydrogen atom, an alkyl group having 1 to 5 carbon atoms, an alkoxyl group having 1 to 5 carbon atoms, a hydroxyalkyl group having 1 to 5 carbon atoms, a hydroxyalkoxyl group having 1 to 5 carbon atoms, or a halogen atom selected from the group consisting of F, Cl, Br and I.
* * * * *